(12) United States Patent
Tsuzuki et al.

(10) Patent No.: US 8,499,825 B2
(45) Date of Patent: Aug. 6, 2013

(54) METHOD FOR MANUFACTURING HEAT TRANSFER MEMBER, POWER MODULE, VEHICLE INVERTER, AND VEHICLE

(75) Inventors: Yoshihiko Tsuzuki, Toyota (JP); Noritaka Miyamoto, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 843 days.

(21) Appl. No.: 12/667,993

(22) PCT Filed: Jul. 17, 2008

(86) PCT No.: PCT/JP2008/063332
§ 371 (c)(1), (2), (4) Date: Jan. 6, 2010

(87) PCT Pub. No.: WO2009/011457
PCT Pub. Date: Jan. 22, 2009

(65) Prior Publication Data
US 2010/0230086 A1 Sep. 16, 2010

(30) Foreign Application Priority Data
Jul. 19, 2007 (JP) ................................. 2007-188443

(51) Int. Cl.
*F28F 7/02* (2006.01)
(52) U.S. Cl.
USPC ........................ 165/80.2; 29/890.03; 361/710
(58) Field of Classification Search
USPC ................ 165/80.2, 185; 361/710; 29/890.03
See application file for complete search history.

(56) References Cited

U.S. PATENT DOCUMENTS

| 217,948 A | 7/1879 | Keith |
| 6,397,450 B1 * | 6/2002 | Ozmat ............................ 29/428 |
| 2003/0219576 A1 * | 11/2003 | Elmoursi et al. .............. 428/210 |
| 2004/0065432 A1 * | 4/2004 | Smith et al. .................. 165/80.2 |
| 2005/0128255 A1 | 6/2005 | Nakanishi |
| 2006/0108601 A1 | 5/2006 | Okamoto |
| 2010/0073883 A1 | 3/2010 | Miyamato et al. |

FOREIGN PATENT DOCUMENTS

| DE | 102 38 975 A1 | 3/2004 |
| EP | 1 387 609 A2 | 2/2004 |
| EP | 1 398 394 A1 | 3/2004 |
| JP | 2004-076157 A | 3/2004 |
| JP | 2004-307969 A | 11/2004 |

(Continued)

OTHER PUBLICATIONS

German Office Action for corresponding DE Patent Application No. 11 2008 001 892.8 issued on Aug. 1, 2011.

*Primary Examiner* — Teresa Walberg
(74) *Attorney, Agent, or Firm* — Sughrue Mion, PLLC (57) ABSTRACT

The present invention provides a method for manufacturing a heat transfer member which method allows peel-off and cracking possibly caused by thermal expansion to be inhibited. That is, the present invention provides a method for manufacturing a heat transfer member 10, the method at least including a step of forming metal powder into a coating film 12 on a surface of a base material 11 by spraying the metal powder in a solid state onto the surface of the base material 11 together with compressed gas. In the film forming step, a spraying pressure at which the metal powder is sprayed onto the surface of the base material 11 is set so that the coating film 12 has a porous structure.

8 Claims, 5 Drawing Sheets

FOREIGN PATENT DOCUMENTS

| | | |
|---|---|---|
| JP | 2005-005638 A | 1/2005 |
| JP | 2005-052449 A | 3/2005 |
| JP | 2005-203761 A | 7/2005 |
| JP | 2006-179856 A | 7/2006 |
| JP | 2007-138236 A | 6/2007 |
| JP | 2007-141901 A | 6/2007 |
| JP | 2007-146281 A | 6/2007 |
| WO | 2008/156093 A1 | 12/2008 |

* cited by examiner

METHOD FOR MANUFACTURING HEAT TRANSFER MEMBER, POWER MODULE, VEHICLE INVERTER, AND VEHICLE

TECHNICAL FIELD

The present invention relates to a method for manufacturing a heat transfer member in which metal powder in a solid state is sprayed onto the surface of a base material with compressed gas to form a coating film with the composition of the metal powder, a power module including the heat transfer member, a vehicle inverter including the power module, and a vehicle in which the vehicle inverter is mounted.

BACKGROUND ART

Figure 7:
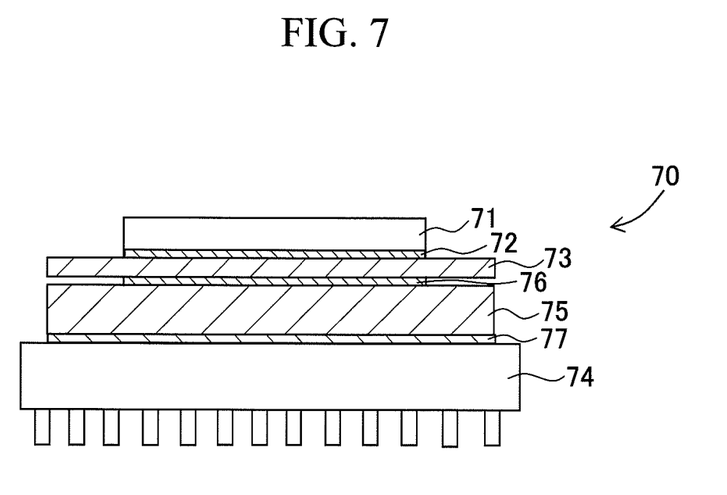
FIG. 7 is a diagram illustrating a conventional power module.

A power module 70 used in an inverter for a vehicle is conventionally composed of electronic components shown in FIG. 7. Specifically, the power module 70 includes at least a power element 71 composed of a silicon element, an insulating member 73 composed of aluminum nitride and to which the power element 71 is fixed via a solder layer 72, and a heat sink member 74 composed of aluminum. Moreover, a cushion member 75 composed of copper-molybdenum (Cu—Mo) or aluminum-silicon carbide (Al—SiC) is disposed between the insulating member 73 and the heat sink member 74. The cushion member 75 is provided in order both to transfer and radiate heat generated by the power element 71 to the heat sink member 74 for radiation and to reduce the difference in thermal expansion between the insulating member 73 and the heat sink member 74. The cushion member 75 is fixed to the insulating member 73 by a solder layer 76 and to the heat sink member 74 by silicon grease 77. Thus, the cushion member 75 and the heat sink member 74 are configured as a heat transfer member for radiating heat from the power element 71.

However, in the power module 70, the silicon grease 77, fixing the cushion member 75, has a lower heat conductivity than the other members and thus disturbs the transfer of heat from the power element 71 to the heat sink member 74. To avoid this, for example, it is expected to be desirable to thermally spray copper-molybdenum (Cu—Mo) directly onto the surface of the heat sink member 74 without using the silicon grease 77, thus forming the cushion member 75 as a coating film.

On the other hand, in recent years, a coating film formation method called a cold spray method has been proposed. The cold spray method uses a convergent and divergent (Laval) nozzle to increase the flow velocity of gas heated to a temperature lower than the melting point or softening temperature of a material for a coating film. The method then introduces metal powder, a material for the coating film, into the gas flow to accelerate the flow. Thus, the metal powder collides against a base material at a high speed while remaining in the solid state, to form a coating film. As an example of the cold spray method, a method has been proposed which compresses very expansive helium gas or nitrogen gas and sprays the metal powder onto the surface of the base material together with the compressed gas, with the metal powder remaining in the solid state, thus forming a coating film with the composition of the powder (see, for example, Patent Document 1).

Patent Document 1; JP Patent Publication (Kokai) No. 2004-76157

DISCLOSURE OF THE INVENTION

However, if a coating film is formed by thermal spraying as described above, powder (Cu, Cu—Mo, or the like) of copper or an alloy thereof is melted by combustion gas or plasma heat, and the molten metal is allowed to fly in the air. Thus, the copper or the alloy thereof is severely oxidized. As a result, the heat conductivity of the coating film formed is less than 30% of that of pure copper even when the coating film is densely formed. Thus, to inhibit possible oxidation in the air, thermal spraying needs to be carried out in a chamber with the pressure therein sharply reduced. Moreover, for the coating film formed by thermal spraying, heat from the molten metal is transmitted to the base material. Thus, after film formation, the coating film and the base material are desirably uniformly cooled. However, uniformly cooling the coating film and base material is difficult. A failure to uniformly cool the coating film and base material may vary the characteristics of the members.

Furthermore, according to such a cold spray method as described in Patent Document 1, the powder in the solid state is sprayed. Thus, the coating film formed is unlikely to be oxidized compared to that formed by thermal spraying. This allows the heat conductivity of the coating film to be improved because the coating film formed has higher purity compared to that formed by thermal spraying. However, even if a power module is manufactured by this method, the reliability of the power module cannot be sufficiently improved.

That is, as shown in FIG. 7, the aluminum nitride in the insulating member 73 has a coefficient of thermal expansion of $5 \times 10^{-6}$/K. The aluminum in the heat sink member 74 has a coefficient of thermal expansion of $23 \times 10^{-6}$/K. If a copper coating film is provided between the members 73 and 74 as a cushion member, the copper in the copper coating film has a coefficient of thermal expansion of close to $17 \times 10^{-6}$/K. The coefficient of thermal expansion of the copper serving as the cushion member fails to be substantially intermediate between that of the aluminum nitride and that of the aluminum but is closer to that of the aluminum. As a result, if a thermal load acts repeatedly from the power element 71 to the heat sink member 74, the interface of the cushion member may be peeled off or the cushion member may be cracked. This may preclude the reliability of a power module and an inverter including the power module from being improved.

The present invention has been developed in view of these problems. An object of the present invention is to provide a method for manufacturing a transmission member which method enables the peel-off and cracking possibly caused by thermal expansion to be inhibited, a reliable power module, a vehicle inverter including the module, and a vehicle including the vehicle inverter.

In order to accomplish the object, the inventors have gained new knowledge. That is, the structure of a coating film of a heat transfer member is focused on, and the coating film is formed to have a porous structure. Thus, the coating film acts as a cushion material to reduce thermal stress caused by a difference in thermal expansion. Therefore, the coating film enables the peel-off and cracking possibly caused by the thermal expansion to be inhibited.

The present invention is based on this new knowledge. The present invention provides a method for manufacturing a heat transfer member, the method at least comprising a step of forming metal powder into a coating film on a surface of a base material by spraying metal powder in a solid state onto the surface of the base material (the base material surface) together with compressed gas, the method being characterized in that in the film forming step, a spraying pressure at which the metal powder is sprayed onto the base material surface is set so that the coating film has a porous structure.

According to the present invention, in the step of forming the coating film on the base material surface, the metal powder in the solid state is conveyed to the base material surface together with the compressed gas without being melted. The metal powder in the solid state is then sprayed onto the base material. The spraying allows the metal powder to be deposited on the base material surface to form a coating film thereon. The coating film is formed with the solid state maintained and is thus more unlikely to be oxidized than one formed by melting. As a result, a metal coating film with a higher purity can be produced on the surface of the base material, ensuring appropriate heat conductivity.

Moreover, according to the present invention, in the film forming step, the metal powder in the solid state is used, and the spraying pressure at which the metal powder is sprayed onto the base material surface is set. Thus, the coating film composed of the metal powder and having the porous structure is formed. As a result, even if the coefficient of thermal expansion of the base material is different from that of a member contacting the coating film of the heat transfer member, the coating film formed between the members has a reduced Young's modulus owing to the porous structure. This enables a reduction in the difference in thermal expansion between the base material and the member contacting the coating film of the heat transfer member. In this manner, the present invention can inhibit peel-off at the interface of the coating film and cracking of the coating film possibly caused by thermal fatigue.

Here, the "spraying pressure at which the metal powder is sprayed onto the base material surface" refers to the pressure at which the metal powder sprayed onto the surface of the base material collides against the surface of the base material. Furthermore, the spraying pressure can be set by setting the pressure (or the flow rate) of the compressed gas and setting the density, size, shape, hardness, and the like of the sprayed metal powder. A method for setting is not particularly limited provided that the coating film has a porous structure.

More preferably, in the film forming step of the manufacturing method according to the present invention, the coating film is formed such that vacancy in the porous structure accounts for 5 to 50 vol % of the coating film. According to the present invention, by setting the rate of the whole coating film accounted for by the vacancy to the above-described range, the peel-off and cracking possibly caused by a difference in thermal expansion can be reliably avoided. That is, if the rate of the vacancy is smaller than 5 vol % of the whole coating film, a more effective coefficient of thermal expansion of the coating film cannot be obtained. Furthermore, if the rate of the vacancy is larger than 50 vol % of the whole coating film, forming a coating film is difficult.

Moreover, examples of the metal powder may include powder containing at least one material selected from, for example, aluminum, chromium, nickel, copper, iron, and an alloy thereof. However, more preferable metal powder is composed of copper or a copper alloy. According to the present invention, the use of the metal powder allows not only the heat conductivity but also the electric conductivity of the coating film to be improved. Moreover, the metal powder has higher heat conductivity than the other materials. The metal powder is thus particularly preferable when the coating film is located between an insulating member of a power module and a heat sink member described below.

Furthermore, examples of the metal powder include atomized powder such as gas-atomized powder or water-atomized powder, or electrolytic powder produced by utilizing electrolysis to deposit the metal on an electrode. The more preferable metal powder is electrolytic powder. According to the present invention, the electrolytic powder has a surface shape including more recesses and protrusions than the other powder. Thus, the electrolytic powder allows a coating film with a porous structure to be more easily formed.

Additionally, examples of the compressed gas include inert gas such as nitrogen gas or helium gas, or air (atmosphere). The compressed gas is not particularly limited provided that the coating film is formed by depositing the metal powder in the solid state and that the coating film can be formed to have a porous structure.

In the film forming step of the method for manufacturing the heat transfer member according to the present invention, if copper or copper powder is used as the powder, the coating film is more preferably formed so as to have a density of between 4.5 g/cm$^3$ and 8.5 g/cm$^3$. By forming the coating film so as to achieve this density range, a coating film can be obtained which is composed of a porous structure with 5 to 50 vol % of vacancy as described above.

Furthermore, in the method for manufacturing the heat transfer member according to the present invention, pressure of the compressed gas is more preferably at most 1.0 MPa. This pressure range allows a coating film with a porous structure to be more easily formed. This enables a reduction in burdens on a facility and the base material during film formation. That is, if the pressure of the compressed gas is higher than 1.0 MPa, facility costs increase. Additionally, upon colliding against the base material surface, the metal powder is more likely to be deformed, making the formation of a coating film with a porous structure difficult. Furthermore, the pressure of the compressed gas is more preferably at least 0.1 MPa. This is because if the pressure is lower than 0.1 MPa, the metal powder is prevented from being easily attached to and deposited on the base material surface.

In the method for manufacturing the heat transfer member according to the present invention, the metal powder preferably has an average grain size of between 5 μm and 60 μm. According to the present invention, metal powder with an average grain size within the above-described range can be reliably attached to the surface of the base material. That is, if the average grain size is smaller than 5 μm, the grain size of the metal powder is excessively small. Thus, a reflected wave (blow-back) of the compressed gas sprayed onto the base material takes part of motion energy of the metal powder. As a result, the efficiency with which the metal powder adheres to the base material decreases. Furthermore, if the average grain size is larger than 60 μm, the volume of the metal powder is small with respect to the surface area thereof Thus, the metal powder is prevented from being easily heated, also reducing the efficiency with which the metal powder adheres to the base material.

In the method for manufacturing the heat transfer member according to the present invention, the metal powder is preferably heated such that the powder at the temperature of at least 50° C. is sprayed onto the surface of the base material. In this manner, the metal powder is heated such that the temperature of the powder to be sprayed onto the base material, that is, the temperature of the powder immediately before collision against the base material, is at least 50° C. The powder is thus formed into a coating film while remaining in the solid state (under a temperature condition of lower than the melting point). This allows the heat conductivity and electric conductivity of the coating film to be further improved. Moreover, the temperature of the metal powder is preferably at most 200° C. If the temperature of the metal powder is higher than 200° C., then before spraying, the metal powder is likely to be aggregated. Moreover, the rate of an oxide in the coating film may increase to impair the advantages of the cold spray method. Furthermore, an efficient method for setting the metal powder to between 50° C. and 200° C. immediately before spraying is to heat the compressed gas to between 250° C. and 550° C. and spray the metal powder onto the base material together with the heated compressed gas.

The method for manufacturing the heat transfer member according to the present invention preferably further comprises, after the film forming step, a step of thermally treating at least the coating film in an inert gas atmosphere under a temperature condition of between 200° C. and 700° C. According to the present invention, the thermal treatment is carried out in the inert gas atmosphere. This prevents the surfaces of the coating film and the base material from being oxidized. Moreover, when the coating film is thermally treated within the above-described temperature range after the film forming step, the oxide present at the boundary between fractions of the metal powder attached together (the boundary between grains forming the coating film) diffuses among the grains. This increases the rate of the metal coupling between the grains. As a result, after the thermal treatment step, the heat transfer member has improved heat conductivity. That is, if the temperature for the thermal treatment is lower than 200° C., increasing the heat conductivity is difficult. Even if the temperature for the thermal treatment is higher than 700° C., a higher effect cannot be expected, and the base material may be thermally affected.

Moreover, the heat transfer member manufactured by the manufacturing method is preferably used for the power module. Preferably, a base material of the heat transfer member is a heat sink member included in the power module, and a coating film of the heat transfer member is located between the heat sink member and an insulating member on which a power element included in the power module is placed.

According to the present invention, the coating film of the heat transfer member is located between the insulating member included in the power module and the heat sink member. This eliminates the need to apply silicon grease hindering heat transfer, to the surface of the heat sink member. Thus, heat from the heated power element can be more suitably transmitted by the heat sink member. Moreover, the coating film has a porous structure and thus enables a reduction in the difference in thermal expansion between the insulating member and the heat sink member. As a result, fatigue strength associated with thermal cycles can be improved, thus enhancing the reliability of the power module.

Moreover, such a power module is preferably used for a vehicle inverter that needs to be composed of reliable devices. Furthermore, the heat transfer member manufactured by the manufacturing method offers high heat conductivity. Thus, the coating film can be effectively used for devices having a heat radiating structure, for example, engine parts of the vehicle and a CPU in an electronic apparatus.

The present invention provides a heat transfer member allowing the peel-off and cracking possibly caused by thermal expansion to be inhibited.

The specification incorporates the contents described in the specification and/or drawings of JP Patent Application No. 2007-188443 on which the priority of the application is based.

Reference numeral 10 denotes a heat transfer member. Reference numeral 11 denotes a base material. Reference numeral 12 denotes a coating film. Reference numeral 30 denotes a power module. Reference numeral 32 denotes a cushion member. Reference numeral 40 denotes an inverter. Reference numeral 71 denotes a power element. Reference numeral 73 denotes an insulating member.

BEST MODE FOR CARRYING OUT THE INVENTION

Figure 1:
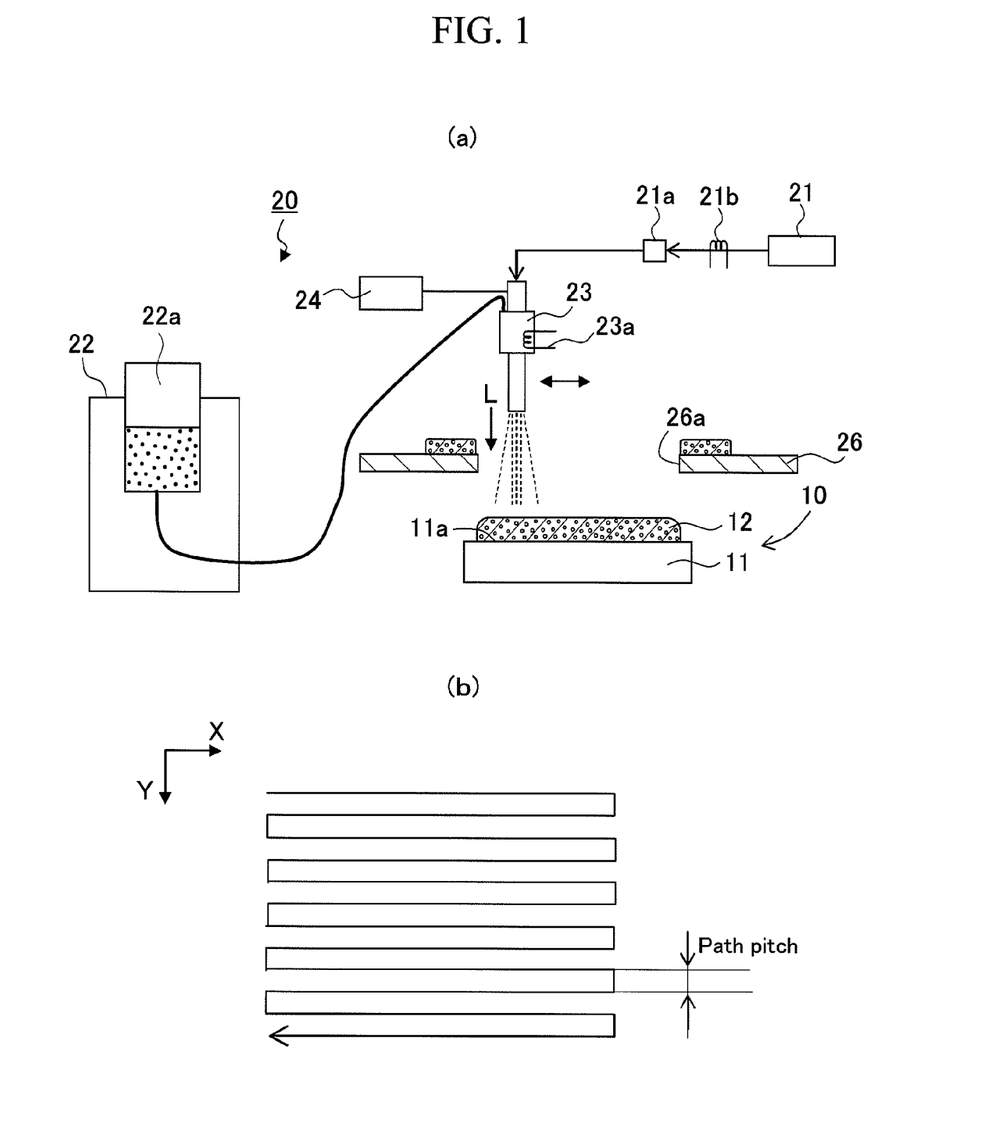
FIG. 1 is a diagram illustrating a method for manufacturing a heat transfer member according to the present embodiment.

An embodiment of a method for manufacturing a heat transfer member according to the present invention will be described below in detail with reference to the drawings. FIG. 1 is a diagram illustrating the method for manufacturing the heat transfer member according to the present embodiment.

A heat transfer member 10 according to the present embodiment includes a base material 11 made of aluminum and on which a coating film 12 is formed by depositing copper powder in a solid state on the base material 11. The heat transfer member 10 can be manufactured using such a film forming apparatus as shown in FIG. 1. The film forming apparatus 20 includes at least compressed gas supply means 21, copper powder supply means 22, a nozzle 23, and nozzle moving means 24.

The compressed gas supply means 21 supplies compressed gas to the nozzle 23 described below. The compressed gas supply means 21 is connected to the nozzle 23 via a pressure adjustment valve 21a adjusting the pressure of the compressed gas. Furthermore, examples of the compressed gas supply means 21 include a cylinder filled with air, inert gas, or the like and a compressor compressing the air. The compressed gas supply means 21 is not particularly limited provided that the compressed gas supply means 21 can supply the nozzle 23 with gas under a pressure condition of between 0.1 MPa and 1.0 MPa. Additionally, heating means 21b is further disposed downstream of the compressed gas supply means 21 to heat the compressed gas. The heating means 21b can heat the compressed gas to allow copper powder described below to be sprayed onto the base material 11 under a desired temperature condition. The heating means 21b indirectly heats the copper powder with the compressed gas. The heating means 21b may thus be located inside the compressed gas supply means 21. The heating means 21b may be omitted provided that a heater 23a described below can be used to heat the copper powder to a desired temperature.

The copper powder to be sprayed onto the base material 11 is accommodated in the copper powder supply means 22. The copper powder supply means 22 is connected to the nozzle 23 so as to enable a predetermined supply amount of the copper powder to be supplied to the nozzle 23. The nozzle 23 is connected to the nozzle moving means 24 and the nozzle moving means 24 can be driven so as to move the nozzle 23 along such a route as shown in FIG. 1(b) described below. Moreover, the heater 23a is provided inside the nozzle 23 to heat the supplied copper powder.

The apparatus 20 is used to manufacture the heat transfer member 10 by the following method. Specifically, first, the base material 11 is located below a masking plate 26 having a rectangular opening 26a. The opening 26a is formed to have a size corresponding to a film formation intended area 11a on the surface of the base material 11. The base material 11 is located such that the opening 26a coincides with the film formation intended area 11a of the base material 11 in a spraying direction L. Then, the pressure adjustment valve 21a is used to adjust the pressure of the compressed gas to at most 1.0 MPa. Furthermore, the heating means 21b is used to heat the compressed gas to a predetermined temperature and then supply the heated compressed gas to the nozzle 23. On the other hand, the copper powder of average grain size 5 to 60 μm is accommodated in a hopper 22a of the copper powder supply means 22 and fed from the copper powder supply means 22 to the nozzle 23.

Then, the copper powder in the solid state is sprayed, via the nozzle 23, onto the surface of the base material 11 together with the compressed gas. Thus, the coating film 12 is formed on the surface of the base material 11. The compressed gas is preheated by the heating means 21b so that the copper powder can be sprayed onto the surface of the base material under a temperature condition of between 50° C. and 200° C. Furthermore, the heater 23a in the nozzle 23 is used to heat the copper powder to adjust the temperature thereof. In this manner, the coating film 12 with a porous structure can be formed such that the coating film 12 as a whole has 5 to 50 vol % of vacancy, that is, a density of between 4.5 g/cm$^3$ and 8.5 g/cm$^3$. In the present embodiment, the average grain size and the pressure of the compressed gas are set to within the above-described ranges as preferable conditions for the pressure at which the copper powder is sprayed onto the surface of the base material. However, the average grain size and the pressure are not limited to these ranges provided that the ranges allow the coating film 12 with a porous structure to be formed.

As shown in FIG. 1(b), the nozzle 23 is linearly moved in a predetermined moving direction (X axis direction in the figure) with respect to the surface (X-Y plane) of the base material 11. Then, the nozzle 23 is moved in a direction (Y axis direction in the figure) at right angles to the above-described moving direction with respect to the base material 11. This movement is sequentially repeated to allow the copper powder to be sprayed into the film formation area on the base material 11. The coating film 12 is thus formed. Moreover, after film formation, the heat transfer member 10 is introduced into a furnace, where the heat transfer member 10 is thermally treated in an inert gas atmosphere (for example, an argon gas atmosphere or a helium gas atmosphere) under a temperature condition of between 200° C. and 700° C. The thermal treatment allows an oxide (oxide film) present at the grain boundary between copper grains (copper powder) attached to and deposited on the base material 11 as the coating film 12 to be diffused among the grains. Thus, the coating film 12 can be provided with higher heat conductivity.

Figure 2:
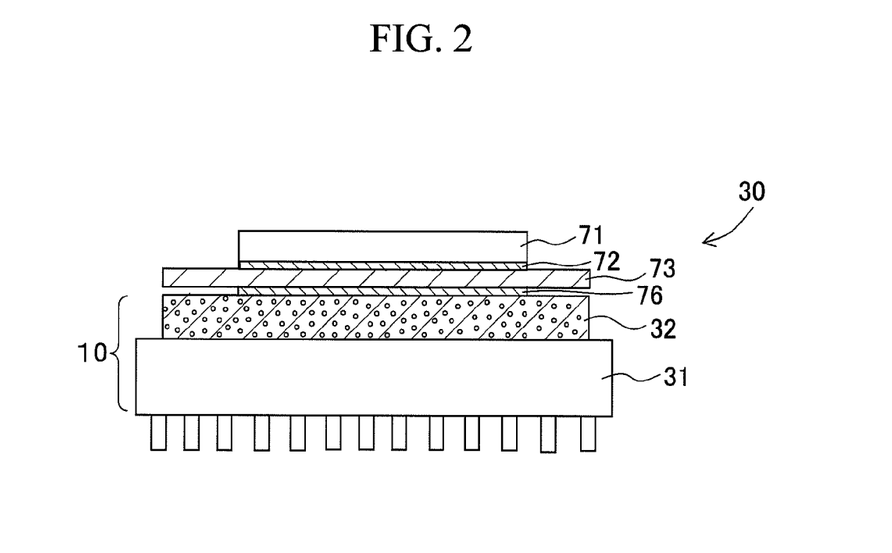
FIG. 2 is a diagram illustrating a power module to which the heat transfer member manufactured by the method shown in FIG. 1 is applied.

FIG. 2 is a diagram illustrating a power module to which the heat transfer member manufactured by the method shown in FIG. 1 is applied. The same members as those of a power module 70 already shown in FIG. 7 are denoted by the same reference numerals and will not be described in detail.

As shown in FIG. 2, a power module 30 includes the heat transfer member 10 manufactured by the above-described method. A base material made of aluminum and belonging to the heat transfer member is included in a heat sink member 31 of the power module 30. Moreover, a coating film made of copper, having a porous structure, and belonging to the heat transfer member is located, as a cushion member 32, between the heat sink member 31 and an insulating member 73 made of aluminum nitride and having a power element 71 placed thereon.

In this manner, the coating film of the heat transfer member is located between the insulating member 73 and heat sink member 31, both forming the power module 30. This eliminates the need to apply silicon grease hindering heat transfer, to the surface of the heat sink member 31. Heat from the heated power element 71 can be suitably transmitted by the heat sink member 31 and thus radiated. Furthermore, the coating film has a porous structure and thus exhibits cushioning characteristics (that is, the coating film has a lower Young's modulus than a coating film with no vacancy). Thus, the coating film enables a reduction in the difference in thermal expansion between the insulating member 73 and the heat sink member 31. This prevents possible peel-off and cracking of the coating film and improves thermal fatigue strength associated with thermal cycles. Thus, the reliability of the power module 30 can be improved.

Figure 3:
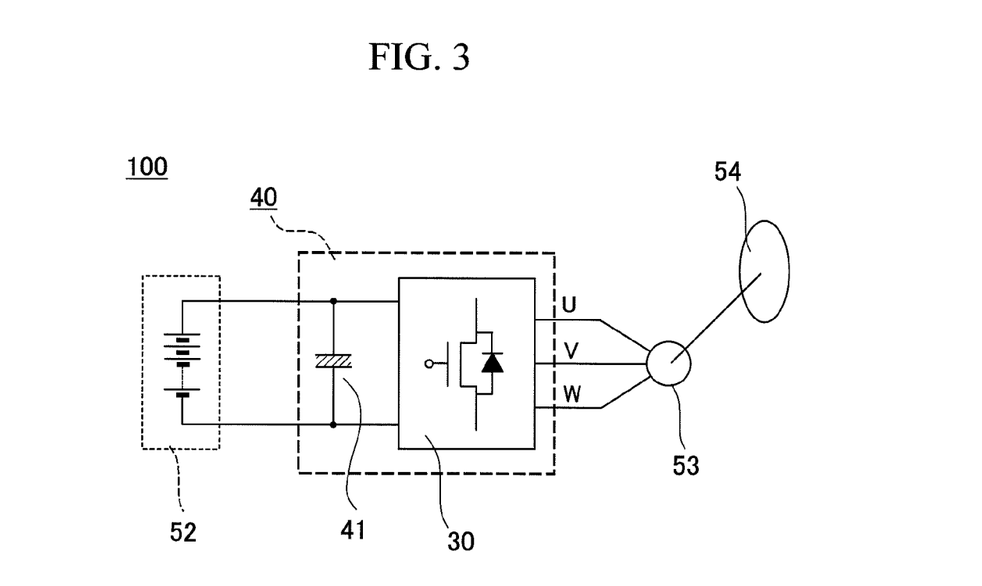
FIG. 3 is a diagram illustrating a vehicle inverter including the power module.

FIG. 3 is a schematic diagram of a vehicle inverter 40 including the power module according to the present embodiment and a vehicle 100 including the vehicle inverter. In FIG. 3, the vehicle inverter 40 in the embodiment is a power conversion apparatus used in a hybrid car using an engine and a motor, an electric car, and the like and converting a direct current into an alternating current to supply power to an AC load on, for example, an induction motor. The vehicle inverter 40 is composed of, in a minimum required configuration, the power module 30 according to the above-described embodiment, a mass capacitor 41, and the like. A DC power source 52 such as a battery is connected to the vehicle inverter 40. A UVW three-phase AC output from the vehicle inverter 40 is supplied to, for example, an induction motor 53, which is thus driven. Moreover, the induction motor is driven to rotate wheels 54 of the vehicle 100, which can thus travel. The vehicle inverter 40 is not limited to the illustrated example but may be in any form provided that the vehicle inverter 40 can offer inverter functions.

In the vehicle inverter 40 configured as described above, if for example, the power element 71 of the power module 30 in FIG. 2 is brought into a high temperature condition during operation, heat from the power element 71 is transferred through a solder layer 72 to the insulating member 73, on which the power element 71 is installed. The heat is then transferred through a solder layer 76 to the coating film, serving as the cushion member 32. The heat is finally radiated from the heat sink member 31, serving as a heat radiating material. At this time, the coating film, having a porous structure and used as the cushion member 32, serves as a cushion material reducing the difference in thermal expansion between the insulating member 73 and the heat sink member 31. Thus, these members can be prevented from being peeled off or cracked, improving the reliability of the vehicle inverter 40. This also improves the safety of the vehicle.

EXAMPLES

The present invention will be described with reference to the following examples.

Example 1

The cold spray method was used to produce a heat transfer member with a copper coating film formed on a base material.

Specifically, a coating film made of copper powder was formed so as to have a density of 7.8 g/cm³ (12.4 vol % of vacancy) by compressing air (atmosphere) and spraying metal powder in the solid state made of copper, onto the surface of a heat sink member (base material) composed of aluminum alloy of size 30 mm×20 mm×thickness 5 mm (HS standard: A6063S-T1) together with the compressed air (compressed gas).

More specifically, a spraying nozzle was placed 30 mm above a heat sink member via a masking plate with an opening for masking having a size of 30 mm×20 mm. Copper powder of average grain size 20 μm was fed into a hopper and supplied to the nozzle at 0.2 g/s. On the other hand, air compressed to 0.6 MPa (compressed gas) was introduced into the nozzle and heated by a heater in the nozzle. The heated gas was then supplied with the copper powder. The copper powder in the solid state was sprayed, together with the compressed gas, onto the surface of the heat sink section composed of aluminum under the following conditions: an air temperature of 450° C., a gas flow velocity of 650 m/sec, and a copper powder flow velocity of 300 m/sec. Then, the nozzle was moved at a path pitch of 1 mm and at a predetermined speed (3 mm/sec) to form a 3.2-mm coating film on the surface of the heat sink member. The surface of the coating film was polished to obtain a heat transfer member with a coating film thickness of 3.0 mm. Then, a heat conductivity, a coefficient of linear expansion, a hardness, and a Young's modulus were measured. The results are shown in Table 1. For reference, Table 1 shows the density, heat conductivity, coefficient of linear expansion, hardness, and Young's modulus of a copper material.

<Observation of the Surface Structure>

Figure 4:
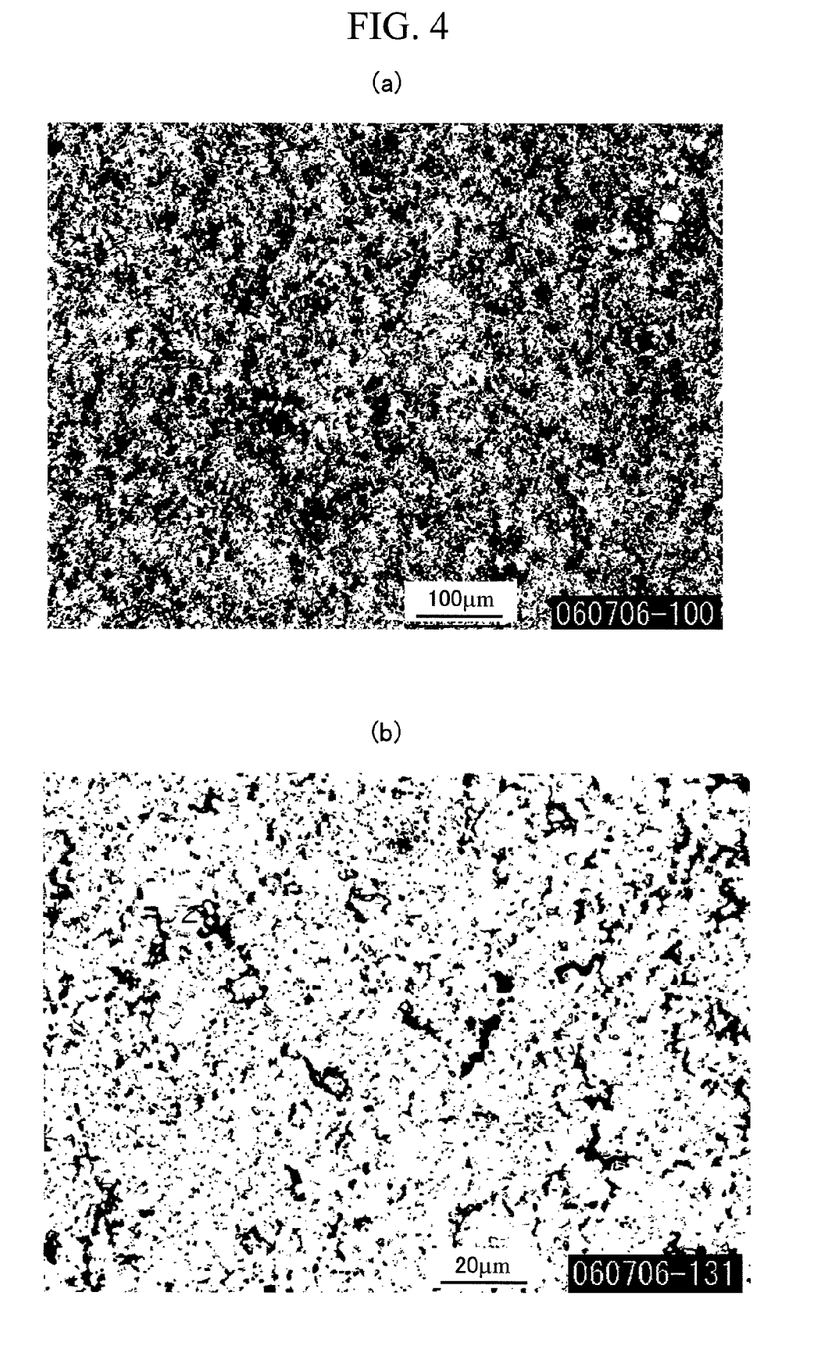
FIG. 4(a) is a photograph showing the surface of a heat transfer member in Example 1 observed with a microscope.
FIG. 4(b) is a photograph showing the surface of a heat transfer member in Example 3 observed with a microscope.

The surface structure of the coating film was observed with a microscope. The results are shown in FIG. 4(a).

<Thermal Cycle Tests>

Figure 5:
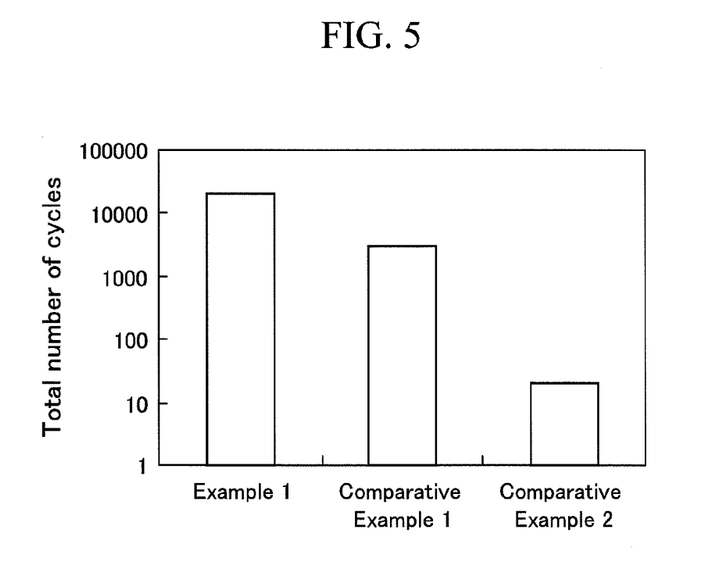
FIG. 5 is a diagram showing the results of thermal cycle tests in Example 1, Comparative Example 1, and Comparative Example 2.

An insulating member made of aluminum nitride was joined, with solder, to the surface of the coating film of the thermally treated heat transfer member, to obtain a test material for thermal cycle tests. Thermal cycle tests were carried out by repeatedly imposing a thermal load on the test material until the test material was damaged in such a manner that the lower limit temperature was set to a predetermined temperature equal to or lower than 0° C., whereas the upper limit temperature was set to a predetermined temperature equal to or higher than 100° C. The results are shown in FIG. 5.

TABLE 1

|  | Example 1 (untreated) | Example 2 (thermal treatment at 300° C.) | Example 3 (thermal treatment at 600° C.) | Reference example |
| --- | --- | --- | --- | --- |
| Density (g/cm³) | 7.8 | 7.8 | 7.8 | 8.9 |
| Heat conductivity (W/m · K) | 121 | 184 | 320 | 398 |
| Coefficient of linear expansion (× 10⁻⁶/K) | 16.3 | 16.1 | 16.0 | 16.6 |
| Hardness (HV) | 94 | 78 | 58 | 180 |
| Young's modulus (× GPa) | 57 | 53 | 51 | 130 |

Example 2

As in the case of Example 1, a heat transfer member was produced. A difference from Example 1 was that after film formation, the heat transfer member was further thermally treated in an argon gas atmosphere under a temperature condition of 300° C. and one hour. As in the case of Example 1, the heat conductivity, coefficient of linear expansion, hardness, and Young's modulus of the thermally treated heat transfer member were measured. The results are shown in Table 1.

Example 3

As in the case of Example 1, a heat transfer member was produced. A difference from Example 1 was that after film formation, the heat transfer member was further thermally treated in an argon gas atmosphere under a temperature condition of 600° C. and one hour. As in the case of Example 1, the heat conductivity, coefficient of linear expansion, hardness, and Young's modulus of the thermally treated heat transfer member were measured. The results are shown in Table 1. Furthermore, the surface structure of the coating film was observed as is the case with Example 1. The results are shown in FIG. 4(b).

Comparative Example 1

As shown in FIG. 7, a heat sink member made of aluminum, which was the same as that in Example 1, was prepared. Instead of the coating film with a porous structure in Example 1, a Cu—Mo plate was stuck to the heat sink member with silicon grease. Moreover, as in the case of Example 1, nitridized aluminum was joined to the surface of the Cu—Mo plate to obtain a test material. Then, thermal cycle tests were carried out under conditions similar to those in Example 1. The results are shown in FIG. 5.

Comparative Example 2

A test material was produced as in the case of Comparative Example 1. A difference from Comparative Example 1 was that a copper plate was used instead of the Cu—Mo plate. Then, thermal cycle tests were carried out under conditions similar to those in Example 1. The results are shown in FIG. 5.

Based on the heat transfer characteristics, manufacturing time, and manufacturing costs of the test material in Comparative Example 1, the transfer characteristics, manufacturing time, and manufacturing costs in Example 1 were determined. The results are shown in Table 2. The heat transfer performance was determined using a laser flash method according to the JIS standard (R1611).

TABLE 2

|  | Example 1 | Comparative Example 1 |
| --- | --- | --- |
| Performance (heat transfer characteristics) | 150 | 100 |
| Operability (operational efficiency) | 120 | 100 |
| Cost | 50 | 100 |

(Result 1)

As shown in Table 1, the heat transfer members in Examples 1 to 3 had a lower Young's modulus than that in Reference Example (pure copper). As shown in FIG. 5, the heat transfer member in Example 1 lasted over more thermal cycles until the heat transfer member was damaged and exhibited a higher thermal fatigue strength, than those in Comparative Examples 1 and 2. The heat conductivity increased in order of Examples 1, 2, and 3. Furthermore, as shown in FIGS. 4(a) and 4(b), in Example 3, in which the thermal treatment was carried out, almost no oxide film was observed at the grain boundary between fractions of the copper powder attached together (the grain boundary between grains forming the coating film).
(Result 2)

As shown in Table 2, compared to Comparative Example 1, Example 1 exhibited an increase in heat transfer performance by 150%, an increase in operational efficiency by 120%, and a reduction in costs down to 50%.
(Discussion 1)

Result 1 indicates that the heat transfer members in Examples 1 to 3 exhibited a lower Young's modulus than that in Reference Example because the coating films in Examples 1 to 3 had a porous structure. The heat transfer member in Example 1 lasted over more thermal cycles (had a higher thermal fatigue strength) than that in Comparative Examples 1 and 2 because the coating film in Example 1 is expected to have enabled a reduction in the difference in thermal expansion between the insulating member and the heat sink member owing to the porous structure thereof and the Young's modulus thereof which was lower than that in Comparative Examples 1 and 2. Furthermore, the heat conductivity increased in order of Examples 1, 2, and 3 because it is expected that during the thermal treatment at the high temperature after the film formation, the oxygen in the oxide film present at the grain boundary between fractions of the copper powder attached together diffused to enhance the metal coupling between the grains.

Example 4

Figure 6:
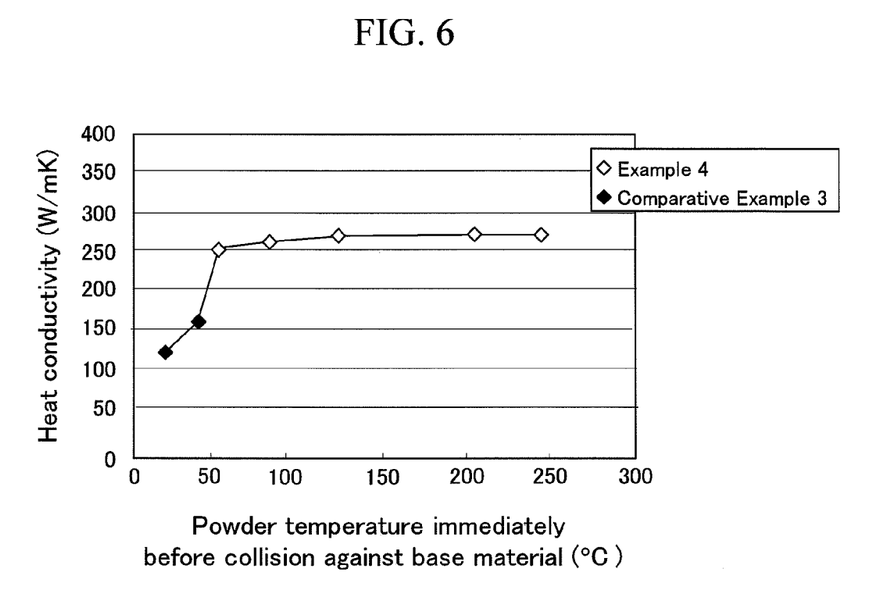
FIG. 6 is a diagram showing the relationship between the temperature of powder and the heat conductivity of a coating film observed immediately before the powder collides against a base material in Example 4 and Comparative Example 3.

As in the case of Example 1, a heat transfer member was produced. A difference from Example 1 was that a coating film was formed under a temperature condition such that the temperature of the copper powder was at least 50° C. immediately before collision against the base material as shown in FIG. 6. The heat conductivity of the coating film was measured by the same method as that in Example 1. The results are shown in FIG. 6.

Comparative Example 3

As in the case of Example 1, a heat transfer member was produced. A difference from Example 1 was that a coating film was formed under a temperature condition such that the temperature of the copper powder was lower than 50° C. immediately before collision against the base material as shown in FIG. 6. The heat conductivity of the coating film was measured by the same method as that in Example 1. The results are shown in FIG. 6.
(Result 3)

As shown in FIG. 6, Example 4 exhibited a higher heat conductivity than Comparative Example 3. Coating films formed at any temperatures equal to or higher than 50° C. exhibited a stable heat conductivity.
(Discussion 2)

To achieve a stable heat conductivity as described above, it is expected to be preferable that the temperature of the copper powder be at least 50° C. immediately before collision against the base material. The improved heat conductivity of the coating film is expected to be due to an increase in the rate of metal coupling in the coating film. The increase in the rate of metal coupling is expected to be due to an increase in energy during film formation as a result of heating of the copper powder.

The contents of all the publications cited in the specification are incorporated herein as a whole. Furthermore, those skilled in the art will easily understand that many variations and changes may be made to the present invention without departing from the scope of the technical concepts and inventions described in the claims. The present invention is intended to encompass such variations and changes.

For example, the present embodiment uses copper powder. However, examples of the powder include a copper alloy, aluminum, chromium, nickel, iron, and an alloy thereof. The powder is not particularly limited provided that the powder can be formed into a coating film of a porous structure. Furthermore, aluminum is used as the base material. However, the base material is not particularly limited provided that the material allows grains of the metal powder to be tightly contacted with one another.

INDUSTRIAL APPLICABILITY

The heat transfer member manufactured by the manufacturing method according to the present invention offers high heat conductivity. The heat transfer member is thus applicable to objects located in severe thermal environments and requiring heat radiation characteristics, for example, engine parts, a CPU in a computer, an audio apparatus in a vehicle, and home electric appliances.

The invention claimed is:

1. A method for manufacturing a power module, the method at least comprising a step of forming metal powder into a coating film on a surface of a base material by spraying the metal powder comprising copper or copper alloy in a solid state onto the base material surface together with compressed gas, the method being characterized in that:
    the metal powder is an electrolytic powder,
    in the film forming step, a spraying pressure at which the metal powder is sprayed onto the base material surface is set so that the coating film has a porous structure,
    the metal powder is heated so as to be sprayed onto the surface of the base material at a temperature condition of between 50° C. and 200° C. to form the coating film, and
    after the film forming step, at least the coating film is thermally treated in an inert gas atmosphere under a temperature condition of between 200° C. and 700° C., such that the oxide present at the boundary between fractions of the metal powder diffuses among the grains.

2. The method for manufacturing the power module according to claim 1, characterized in that the coating film is formed such that vacancy in the porous structure accounts for 5 to 50 vol % of the coating film.

3. The method for manufacturing the power module according to claim 1, characterized in that the coating film is formed so as to have a density of between 4.5 g/cm$^3$ and 8.5 g/cm$^3$.

4. The method for manufacturing the power module according to claim 1, characterized in that pressure of the compressed gas is at most 1.0 MPa.

5. The method for manufacturing the power module according to claim 1, characterized in that the metal powder has an average grain size of between 5 μm and 60 μm.

6. A power module manufactured by the manufacturing method according to claim 1, the power module being characterized in that a base material of the heat transfer member is a heat sink member included in the power module, and
    a coating film of the heat transfer member is located between the heat sink member and an insulating member on which a power element included in the power module is placed.

7. A vehicle inverter comprising the power module according to claim 6.

8. A vehicle comprising the vehicle inverter according to claim 7.

* * * * *